United States Patent [19]

On

[11] Patent Number: 5,039,883

[45] Date of Patent: Aug. 13, 1991

[54] DUAL INPUT UNIVERSAL LOGIC STRUCTURE

[75] Inventor: Kevin On, Cupertino, Calif.

[73] Assignee: NEC Electronics Inc., Mountain View, Calif.

[21] Appl. No.: 482,615

[22] Filed: Feb. 21, 1990

[51] Int. Cl.$^5$ .......................................... H03K 19/017
[52] U.S. Cl. .................... 307/465; 307/449; 307/243; 365/156
[58] Field of Search .............. 307/449, 451, 465, 468, 307/469, 471, 243, 272.2; 365/156

[56] References Cited

U.S. PATENT DOCUMENTS

| | | | |
|---|---|---|---|
| 4,453,096 | 6/1984 | Le Can et al. | 307/469 X |
| 4,620,117 | 10/1986 | Fang | 307/451 |
| 4,710,649 | 12/1987 | Lewis | 307/451 |
| 4,866,305 | 9/1989 | Hasegawa | 307/451 X |
| 4,893,031 | 1/1990 | Masuda | 307/465 X |
| 4,910,417 | 3/1990 | El Gamal et al. | 307/465 |

*Primary Examiner*—David Hudspeth
*Attorney, Agent, or Firm*—Skjerven, Morrill, MacPherson, Franklin & Friel

[57] ABSTRACT

A dual input universal logic structure allows many logical functions to be implemented using a relatively small number of CMOS transistors. The dual input structure implements the following logical equation:

$$OUT = \overline{A} + B$$

or $$\overline{OUT} = A \cdot \overline{B}$$

The dual input universal logic structure comprises a p-channel field-effect transistor (FET) and an N-channel field-effect transistor. A multiplexer circuit and an exclusive NOR circuit which each require only four CMOS transistors may be implemented using the dual input logic structure. likewise, a two-by-four decoder may be implemented using only ten CMOS transistors. Since a fewer number of CMOS transistors are required to implement certain functions, the space requirements of the circuits are reduced and denser circuit packaging may be achieved in VLSI integrated circuits. In addition, the dual input logic structure may be used within a random access memory circuit to decrease power consumption and soft error rate.

4 Claims, 16 Drawing Sheets

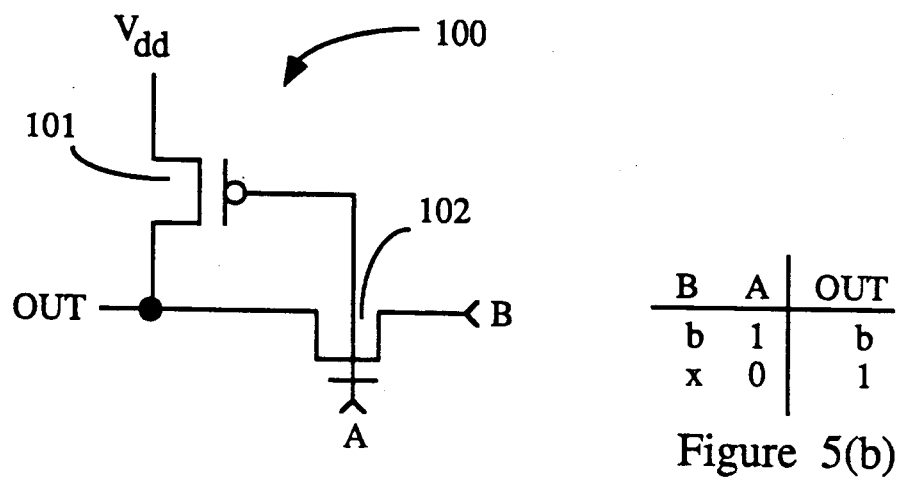
Figure 5(a)
Figure 5(b)
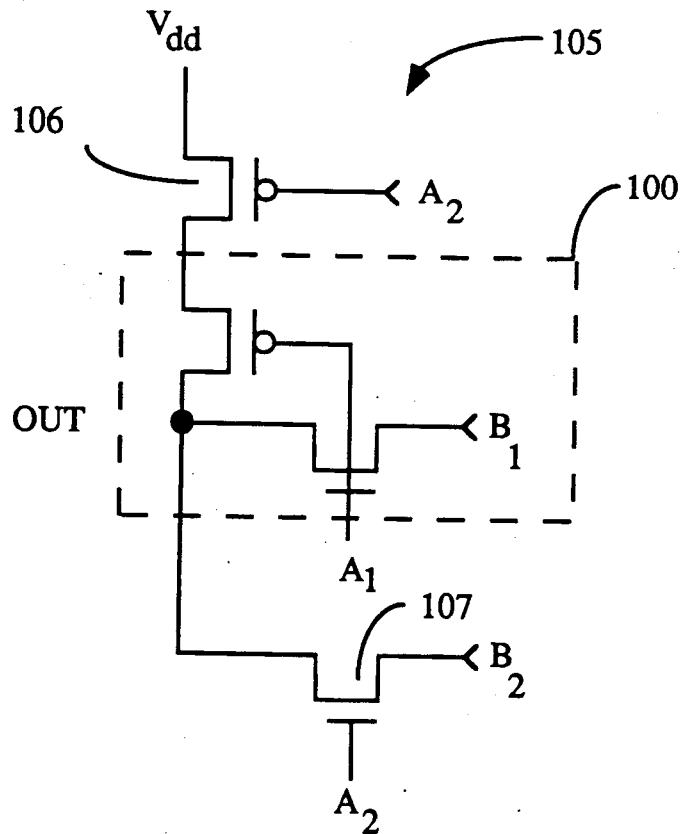
Figure 6

DUAL INPUT UNIVERSAL LOGIC STRUCTURE

BACKGROUND OF THE INVENTION

1. Field of the Invention

The invention relates generally to a universal logic structure and more particularly to a dual input universal logic structure for implementing VLSI logic and memory.

2. Description of the Relevant Art

The design of digital circuitry to implement a logical function has primarily involved interconnecting basic logic elements such as AND, OR, NAND, NOR, and inverter gates. After a designer has determined the logical equation to be implemented by circuitry, the basic logic gates may be interconnected in a straightforward approach to implement the logical function. The number of gates required is usually dependent upon the number of terms and the form of the logical equation to be implemented. It is usually desirable to minimize the number of logical elements used, and there are many techniques which allow a designer to reduce the logical equation in order that the number of gates required may be minimized.

The term "logic design" refers to the process of specifying an interconnection of logic elements in digital computer hardware so that a desired function is performed. Examples of this process might be the design of a circuit that accepts data representing numbers in a gray code and converts this data into a binary-coded decimal representation, or the design of a multiplexer circuit that provides input data from one of two input lines to an output line depending upon the value of a control line. Both formal and ad hoc techniques are used to achieve the desired design.

The basic logic gates are the smallest building blocks that can be represented by operators in an appropriate system of symbolic logic. All digital logic networks in current use operate on signals that are restricted to two possible values only, and are thus called binary values. Table 1(a)-(e) lists each possible combination of binary signals at the inputs of the basic logic gates and the corresponding combination of desired output signals.

TABLE 1(a)-1(e)

| Inputs | | Output |
|---|---|---|
| (a) Inverter | | |
| 0 | | 1 |
| 1 | | 0 |
| (b) AND gate | | |
| 0 | 0 | 0 |
| 0 | 1 | 0 |
| 1 | 0 | 0 |
| 1 | 1 | 1 |
| (c) OR gate | | |
| 0 | 0 | 0 |
| 0 | 1 | 1 |
| 1 | 0 | 1 |
| 1 | 1 | 1 |
| (d) NAND gate | | |
| 0 | 0 | 1 |
| 0 | 1 | 1 |
| 1 | 0 | 1 |
| 1 | 1 | 0 |
| (e) NOR gate | | |
| 0 | 0 | 1 |
| 0 | 1 | 0 |
| 1 | 0 | 0 |
| 1 | 1 | 0 |

Each of the basic logic gates is internally composed of electronic components interconnected to perform the associated logical function, typically including a number of CMOS transistors. FIGS. 1(a)-(e) show typical internal circuitry within each of the corresponding basic logic gates. As shown in FIG. 1(a), a NOT gate 10 comprises two CMOS transistors 11 and 12. A two-input NAND gate 13 comprises four CMOS transistors 14-17 as shown in FIG. 1(b). Similarly, a two-input NOR gate 20 shown in FIG. 1(c) comprises four CMOS transistors 21-24. As shown in FIG. 1(d), a two-input AND gate 25 comprises six CMOS transistors 26-31. Finally, as shown in FIG. 1(e), a two-input OR gate 32 comprises six CMOS transistors 33-38. Although there are circuit configurations other than those shown in FIGS. 1(a)-1(e) which may be designed to implement the logical functions represented by Tables 1(a)-1(e), the circuit configurations as shown represent the simplest forms which require the fewest number of transistors to implement the associated logical functions.

FIG. 2(a) shows a logic diagram of a multiplexer 40 designed using the basic logic gates. Multiplexer 40 includes inverter gates 41 and 42, AND gates 43 and 44, and NOR gate 45. If conventional logic were used to construct multiplexer 40, the resulting overall internal circuit configuration would be as shown in FIG. 2(b). The logic equation implemented by multiplexer 40 is:

$$OUT = A_1 \cdot B_1 + A_2 \cdot B_2 \qquad \text{eq. (1)}$$

As shown in FIG. 2(b), when multiplexer 40 is designed using conventional logic, the resulting overall internal circuit consists of a total of twelve CMOS transistors 46-57.

FIG. 3(a) is a logic circuit of an exclusive NOR gate 60 implemented using conventional logic. Exclusive NOR gate 60 consists of two inverters 61 and 62, and two transmission gate switches 63 and 64. Since a transmission gate switch comprises two CMOS transistors 65 and 66 as shown in FIG. 3(b), exclusive NOR gate 60 internally consists of eight CMOS transistors 67-74 as shown in FIG. 3(c).

FIG. 4 shows a logical circuit which implements a decoder function. A two-input, four-output decoder 75 shown comprises two inverter gates 76 and 77 and four NAND gates 78-81. Thus, when logic gates having internal circuitry as shown in FIGS. 1(a) and 1(b) are used to implement the decoder function, the resulting circuit comprises a total of twenty CMOS transistors.

In VLSI (very large scale integration) circuitry, a large number (i.e., over ten thousand) of the basic logical gates may be fabricated on a single integrated circuit chip. The number of basic logic gates used dictate the number of actual FETs which are fabricated on the integrated circuit chip, and consequently determine the size requirements of the chip. It is desirable to decrease the size requirements of VLSI chips and to minimize the number of CMOS transistors used to implement a given logical equation. In addition, it is further desirable to increase the speed at which VLSI circuitry may operate.

SUMMARY OF THE INVENTION

A dual input universal logic structure allows many logical functions to be implemented using a relatively small number of CMOS transistors. The dual input structure implements the following logical equation:

$$OUT = A + B \qquad \text{eq. (2)}$$

or $$OUT = A \cdot B \qquad \text{eq. (3)}$$

The dual input structure consists of two CMOS transistors. When the dual input structure is used in a circuit design, it is often the case that a fewer overall number of CMOS transistors are required than would be required if basic logic gates were used.

The dual input structure may be used to implement a multiplexer or an exclusive NOR function which each require only four CMOS transistors. Likewise, a two-by-four decoder may be implemented using only ten CMOS transistors. Since a fewer number of CMOS transistors are required to implement certain functions, the space requirements of the circuits are reduced. Furthermore, since both gate and diffusion loading are decreased, the circuits may operate faster.

The dual input universal logic structure comprises a P-channel field-effect transistor (FET) and an N-channel field-effect transistor. The source of the P-channel FET is connected to receive a first supply voltage, and a first terminal of the N-channel FET is connected to a first input line. The gates of each of the FETs are connected to each other at a common node which forms a second input line. The drain of the P-channel FET is connected to a second terminal of the N-channel FET at a common node which forms an output line.

The dual input logic structure may further be used to improve latching and memory circuitry. For example, the dual input logic structure may be used within a random access memory circuit to decrease power consumption and soft error rate.

The invention will be more readily understood by reference to the drawings and the detailed description. As will be appreciated by one skilled in the art, the invention is applicable to a universal logic structure in general, and is not limited to VLSI circuitry.

BRIEF DESCRIPTION OF THE DRAWINGS

FIG. 5(a) shows a dual input universal logic structure according to the invention comprising a P-channel and an N-channel FET.

FIG. 5(b) shows a logic table for the dual input universal logic structure.

FIG. 6 shows a multiplexer circuit which includes the dual input logic structure of FIG. 5.

DETAILED DESCRIPTION OF THE INVENTION

Figure 1A:
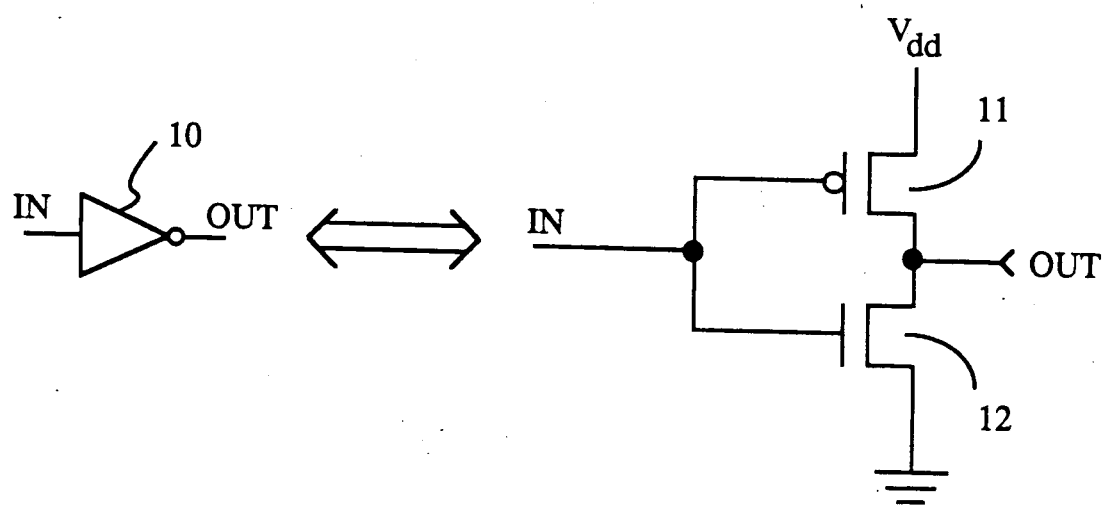
FIG. 1(a) illustrates the logic symbol of an inverter gate and its corresponding internal circuitry.
Figure 1B:
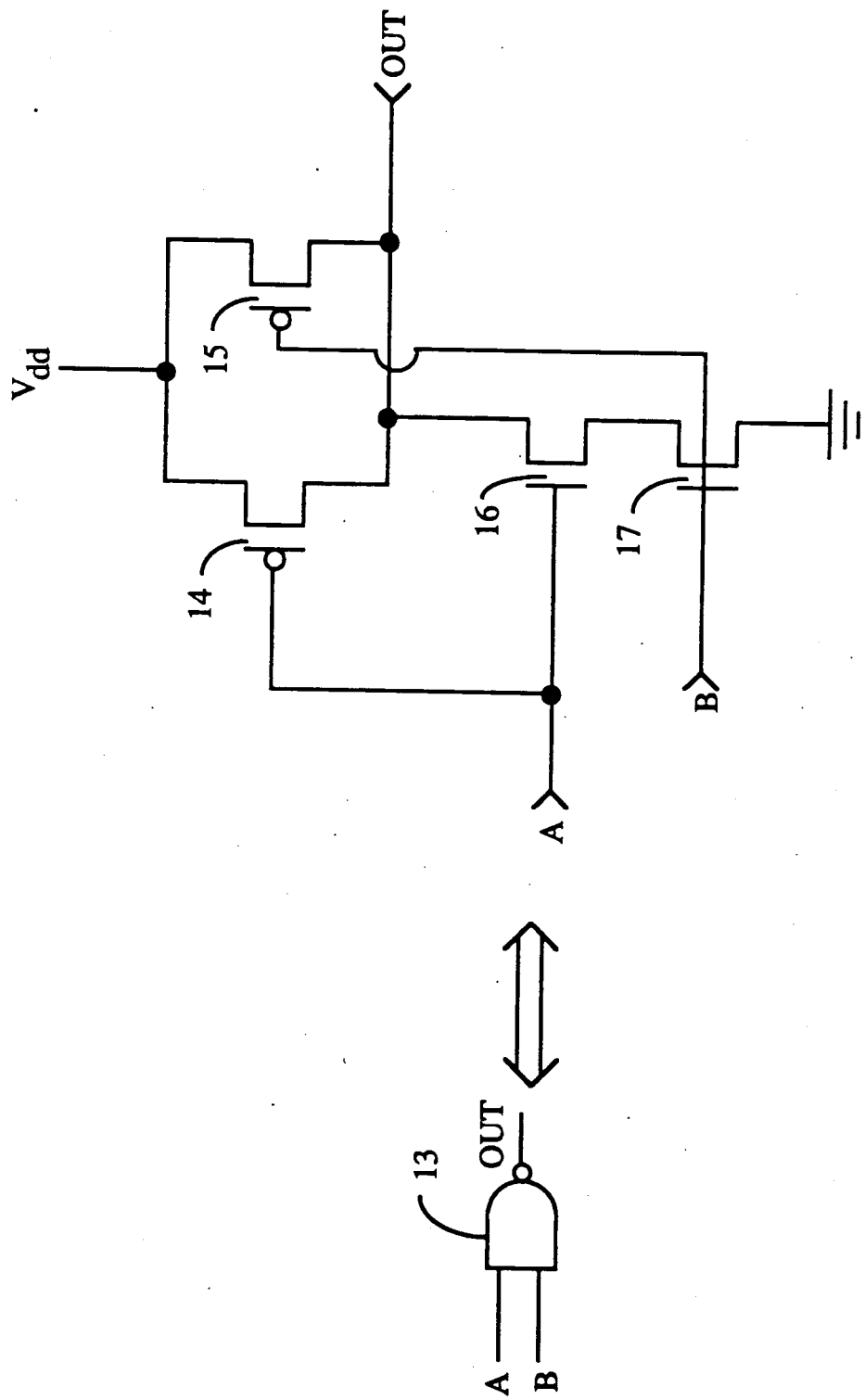
FIG. 1(b) illustrates the logic symbol for a NAND gate and its corresponding internal circuitry.
Figure 1C:
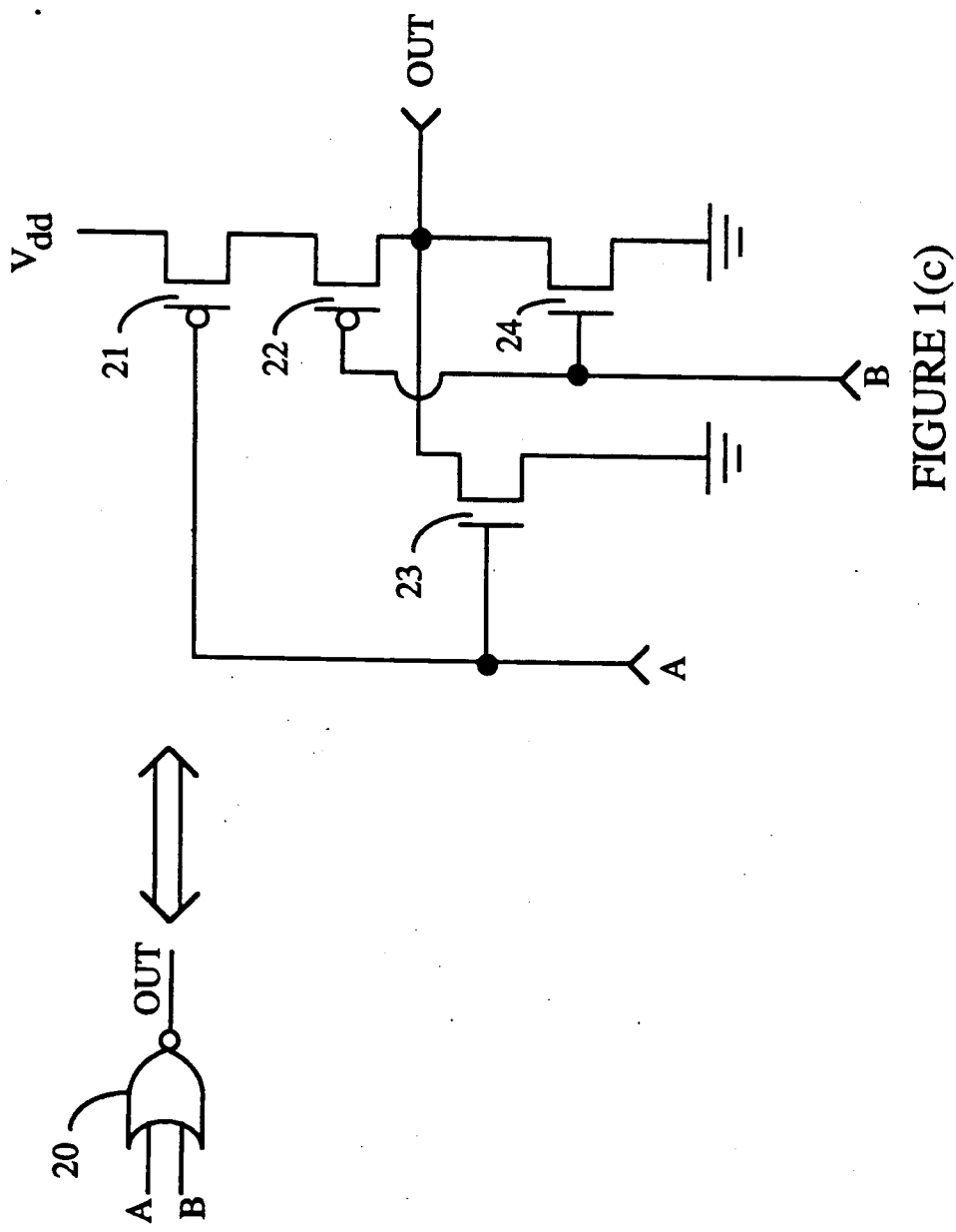
FIG. 1(c) illustrates the logic symbol for a NOR gate and its corresponding internal circuitry.
Figure 1D:
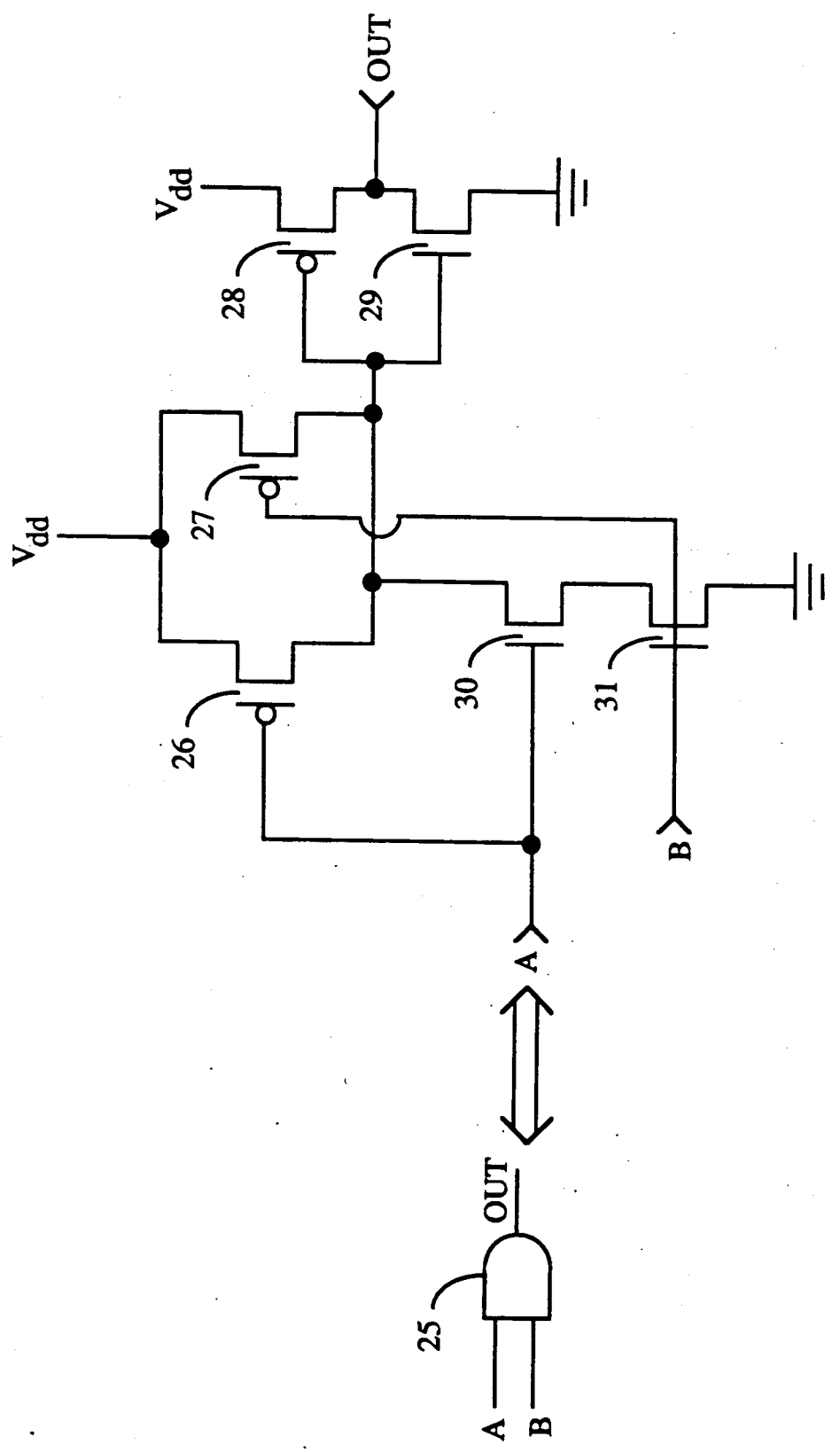
FIG. 1(d) illustrates the logic symbol for an AND gate and its corresponding internal circuitry.
Figure 1E:
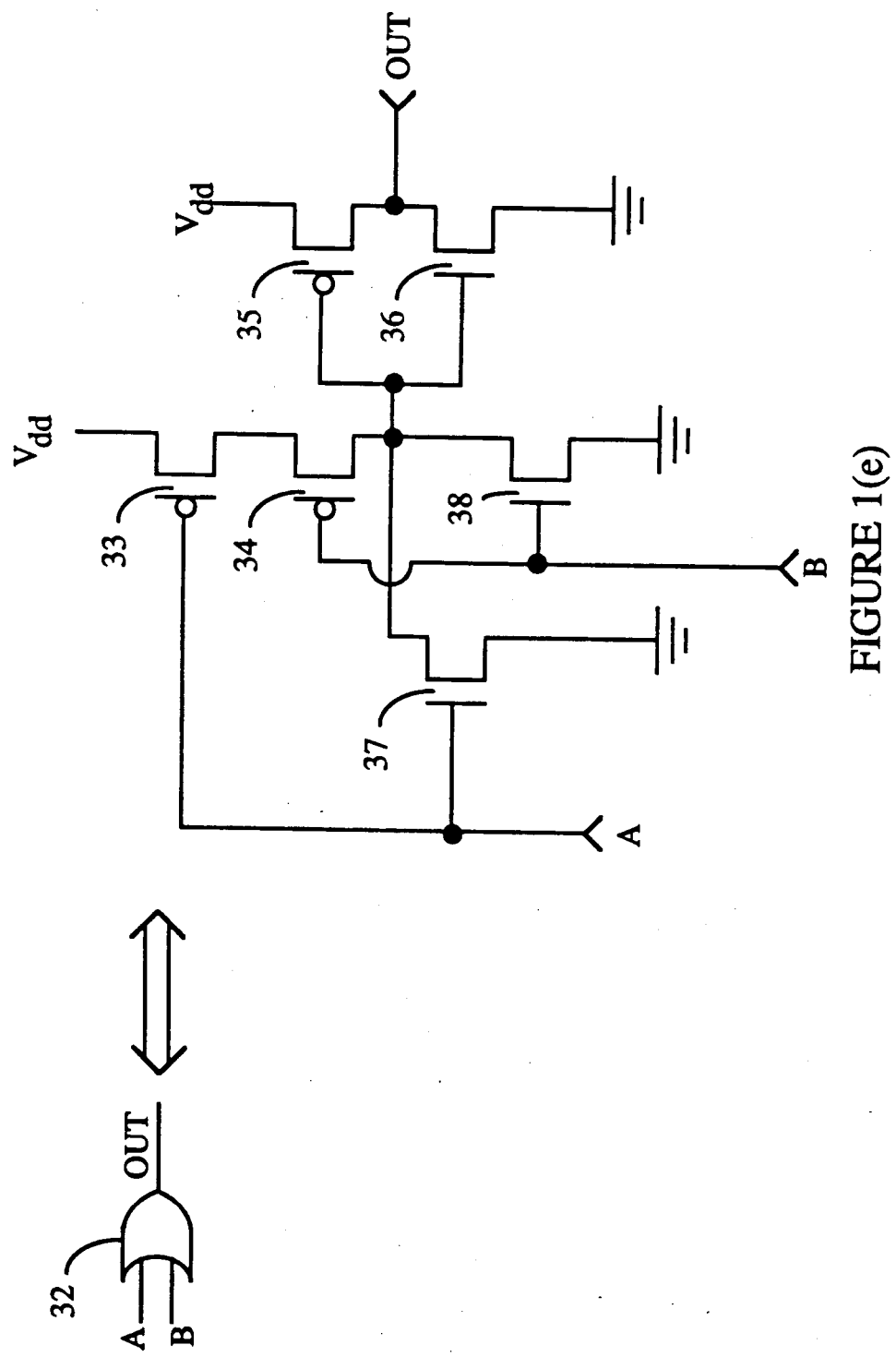
FIG. 1(e) illustrates the logic symbol for an OR gate and its corresponding internal circuitry.

Referring to FIG. 5(a), a dual input universal logic structure 100 according to the invention is shown. Dual input structure 100 comprises a P-channel field effect transistor (CMOS) 101 and an N-channel field effect transistor (CMOS) 102. The source of P-channel FET 101 is connected to receive a first supply voltage $V_{dd}$. A first terminal, either the drain or the source, of N-channel FET 102 is connected to an input line designated as B for receiving a second voltage. The gates of each transistor 101 and 102 are connected together at a common node and form an input line designated as A for receiving a third voltage. The drain of P-channel FET 101 is connected to a remaining second terminal, either the drain or the source, of N-channel FET 102 at a common node which forms an output line (OUT) for supplying a fourth voltage. It should be noted that the connections of the drain and the source of transistor 102 within dual input logic structure 100 may be interchanged. That is, dual input logic structure 100 will operate if the source of transistor 100 is connected to the output line and the drain is connected to input line B, as well as if the drain were connected to the output line and the source to input line B.

The operation of dual input logic structure 100 is easily analyzed. When the voltage level at input line A is logic LOW, N-channel FET 102 is turned off and thus does not conduct, while P-channel transistor 101 is turned on. Consequently, the supply voltage $V_{dd}$ is coupled through a low impedance to the output line, causing the output line to go HIGH. When the voltage level at input line A is LOW, the output line remains HIGH regardless of the voltage level at input line B.

When the voltage level at input line A is logical HIGH, P-channel transistor 101 is turned off, while N-channel transistor 102 is turned on. As a result, the output line is coupled through a low impedance to input line B, and thus the logical voltage level at the output line is equal to the logical level at input line B.

The logic table of FIG. 5(b) is representative of the operation of dual input logic structure 100 where "X" is a don't care state and "b" is the value at input line B just prior to input line A switching to a HIGH state. The logical equation is given by:

$$OUT = A + B \qquad \text{eq. (2)}$$

or $$OUT = A \cdot B \qquad \text{eq. (3)}$$

Dual input logic structure 100 explained above may be used as a building block within circuits which implement more complex logical equations. For example, dual input logic structure 100 may be used as a building block to design a circuit implementing the multiplexing function given by eq. (1). Similarly, dual input logic structure 100 may be used as a building block to form an exclusive NOR circuit or a decoder circuit. When the design of a circuit includes dual input logic structure 100 for implementing a particular logical function, the resulting electrical circuit is often composed of fewer CMOS transistors than would be required if conventional logic were used.

Figure 2A:
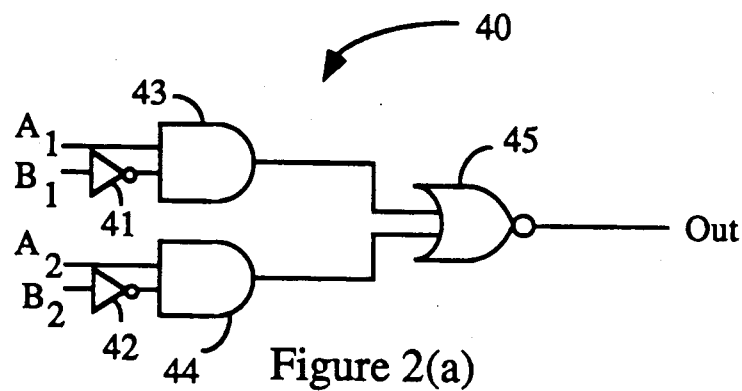
FIG. 2(a) is a logic diagram of a multiplexer using conventional logic.

FIG. 6 is a multiplexer circuit 105 which implements the same function implemented by the circuit of FIG. 2. Multiplexer 105 comprises dual input logic structure 100 and includes two additional CMOS transistors 106 and 107. The logic equation of multiplexer 105 is given by:

$$OUT = A_1 \cdot B_1 + A_2 \cdot B_2 \qquad \text{eq. (4)}$$

Figure 2B:
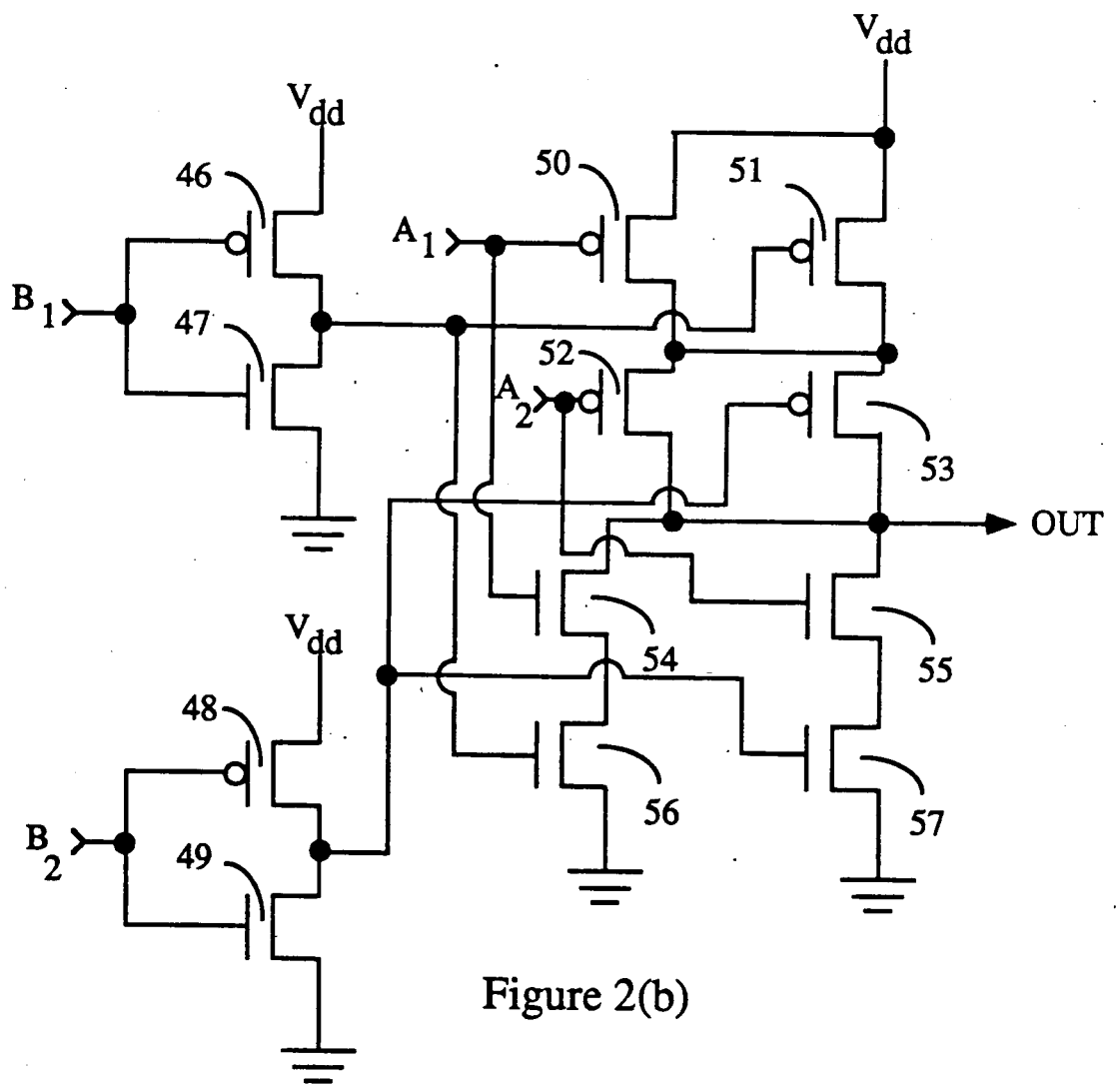
FIG. 2(b) shows the internal circuitry within the conventional logic of the multiplexer.

Multiplexer circuit 105 utilizes only four CMOS transistors to implement the very same function as the multiplexer circuit shown in FIG. 2(b) which requires twelve transistors. As a consequence, less space on a VLSI chip is required to fabricate multiplexer circuit 105 of FIG. 6.

Figure 7:
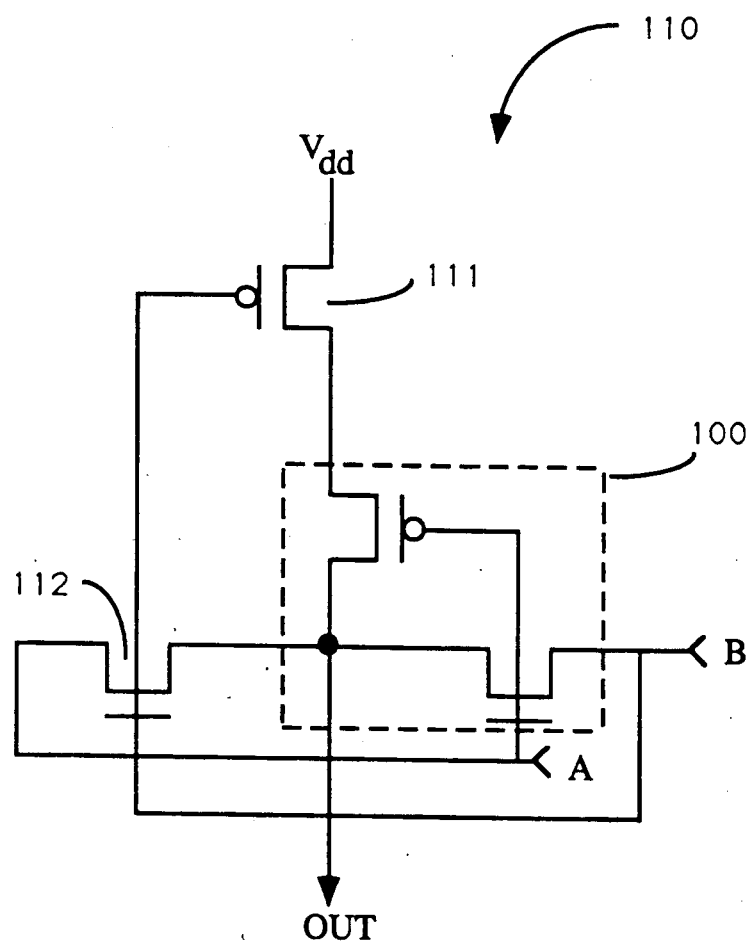
FIG. 7 shows an exclusive NOR circuit which includes the dual input logic structure of FIG. 5.

FIG. 7 shows a circuit 110 which implements an exclusive NOR function. Exclusive NOR circuit 110 includes dual input logic structure 100 and two additional CMOS transistors 111 and 112. The logical function implemented is given by the equation:

$$OUT = A \cdot B + B \cdot A \qquad \text{eq. (5)}$$

Figure 3A:
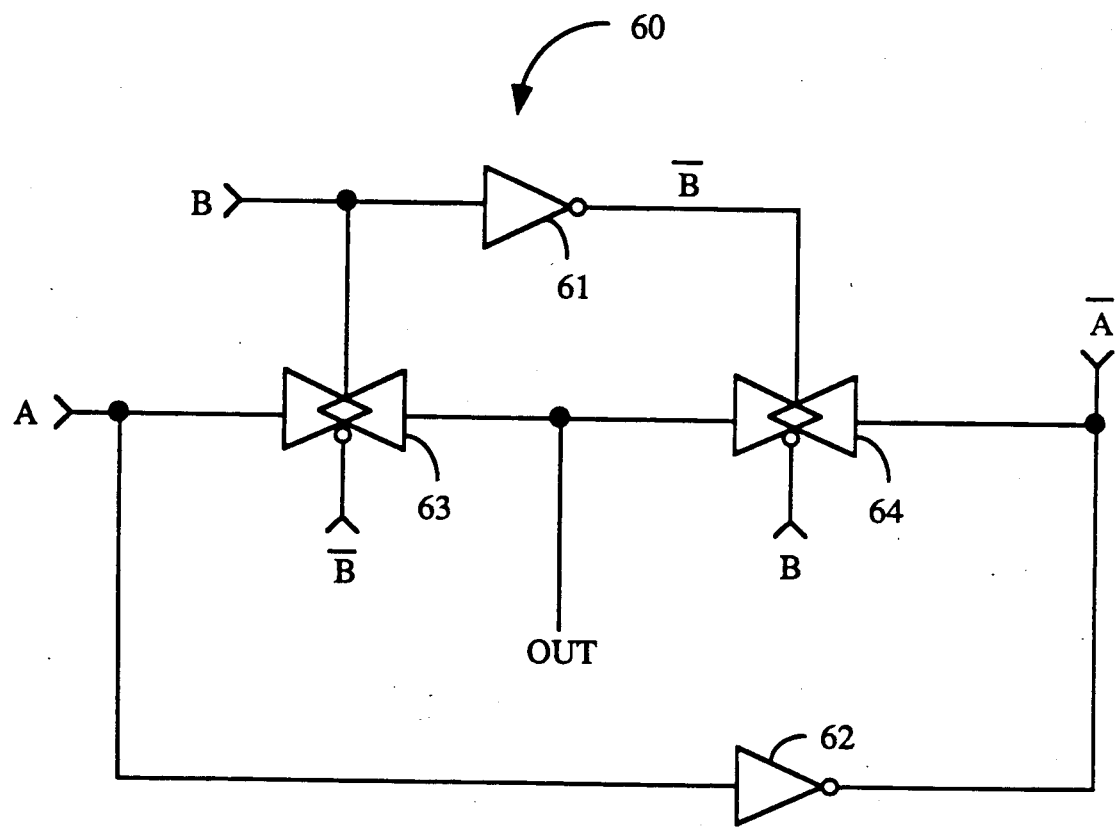
FIG. 3(a) is a logic diagram of an exclusive NOR gate using conventional logic.
Figure 3B:
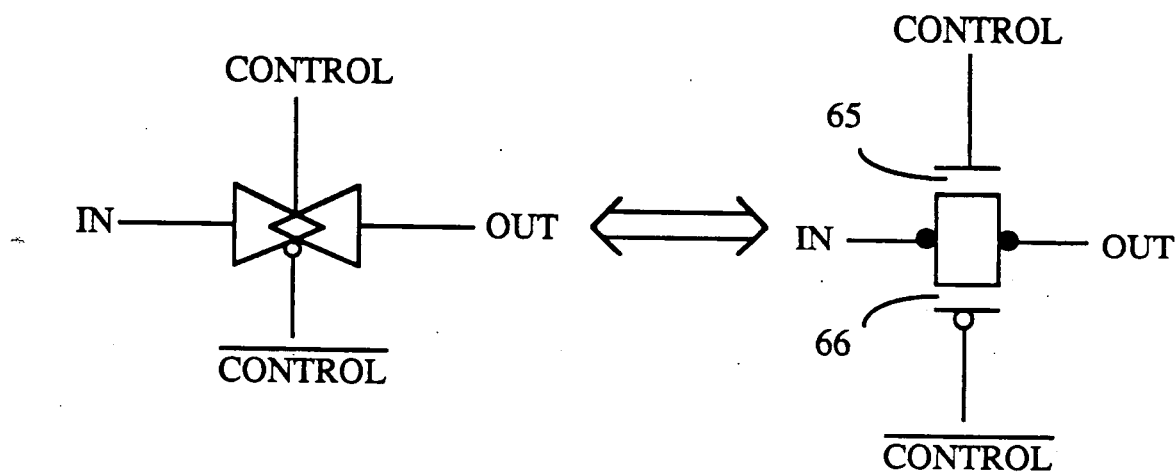
FIG. 3(b) illustrates the logic symbol of a transmission gate switch and its corresponding internal circuitry.
Figure 3C:
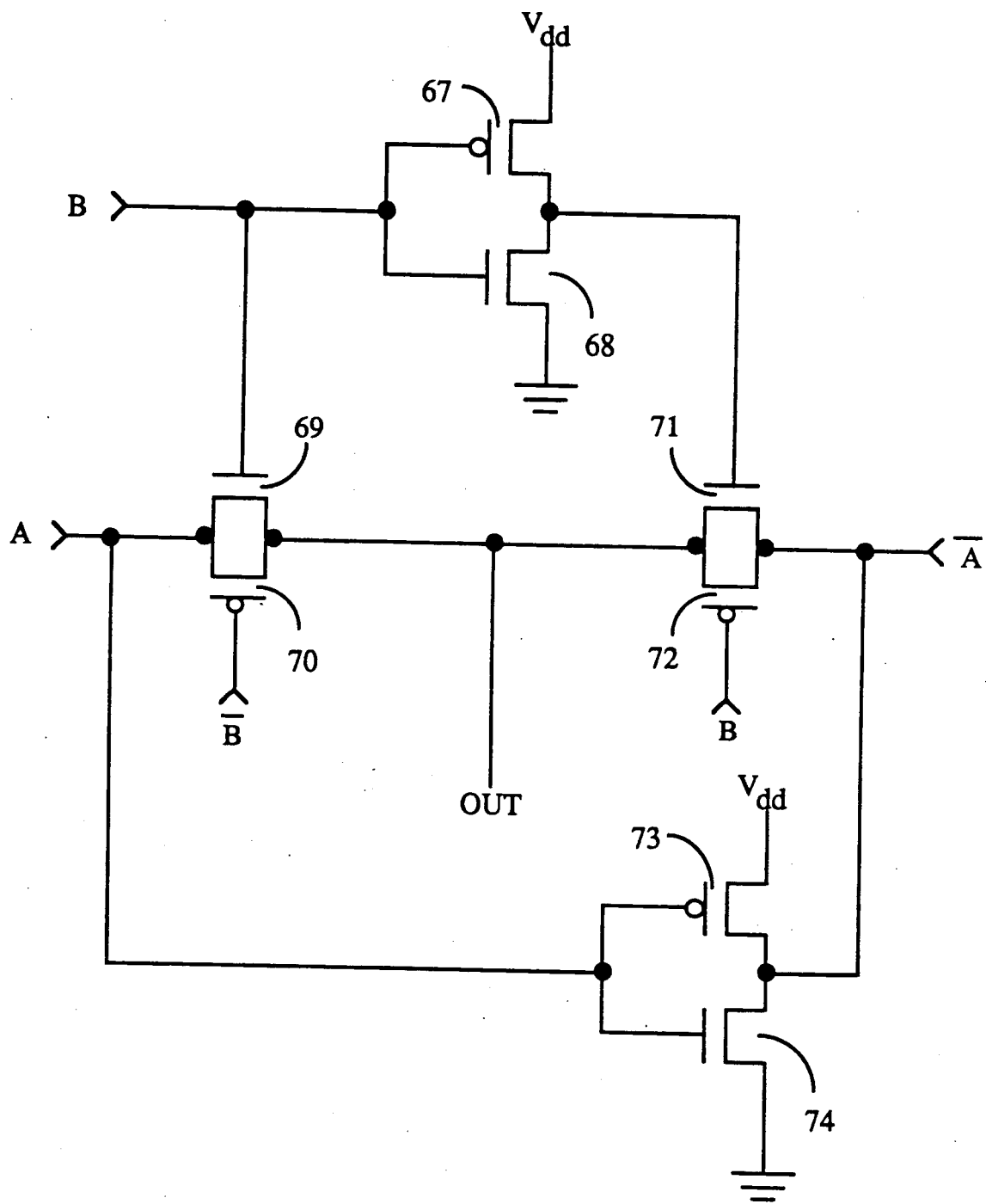
FIG. 3(c) shows the internal circuitry of the exclusive NOR gate using conventional logic.

The exclusive NOR function as implemented by exclusive NOR circuit 110 of FIG. 7 requires only four CMOS transistors, while the circuit of FIG. 3(c) which implements the same function requires a total of eight CMOS transistors. Again, use of dual input logic structure 100 results in a circuit requiring fewer CMOS transistors and hence less space in comparison to that required when conventional logic is used.

Figure 4:
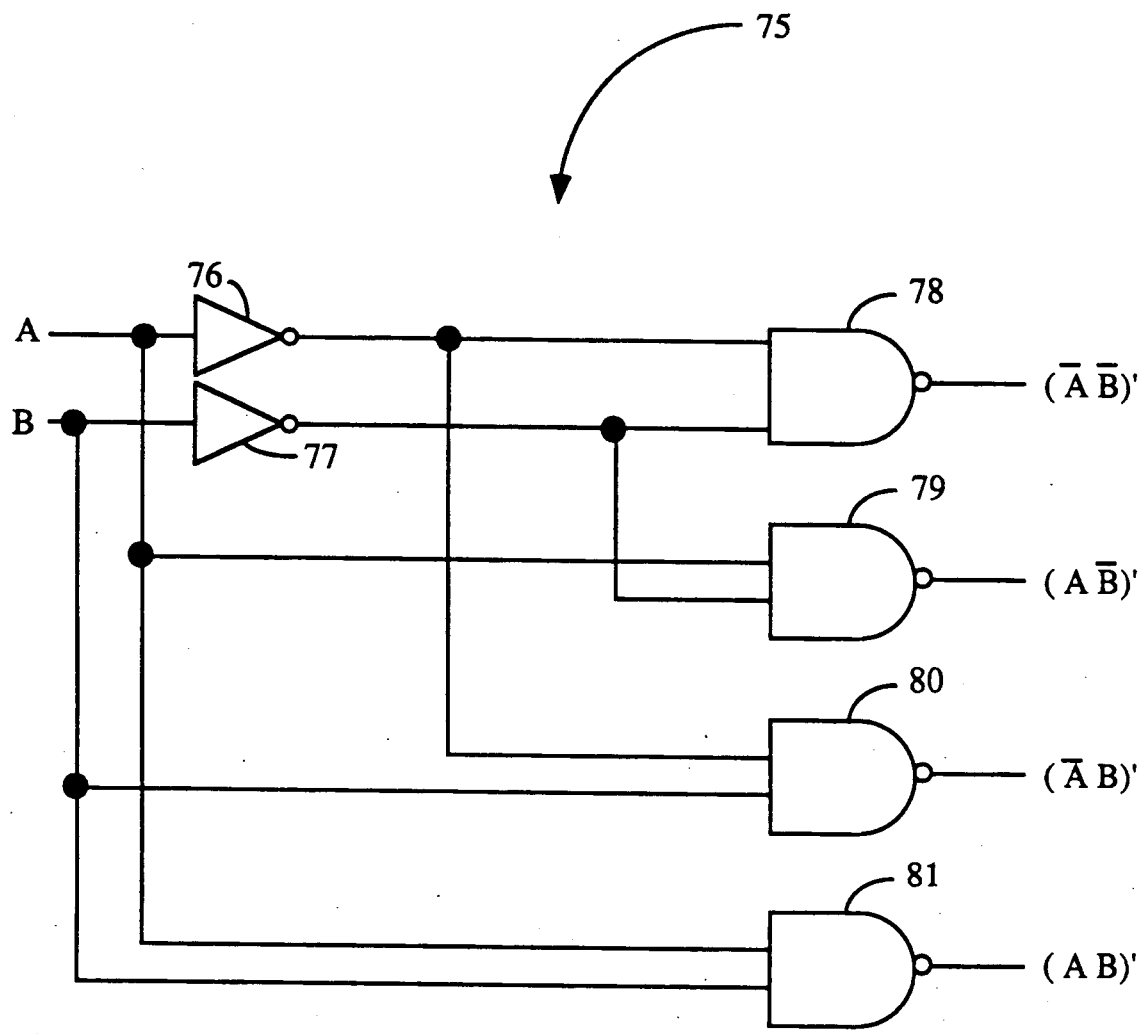
FIG. 4 shows a a two-by-four decoder using conventional logic.
Figure 8:
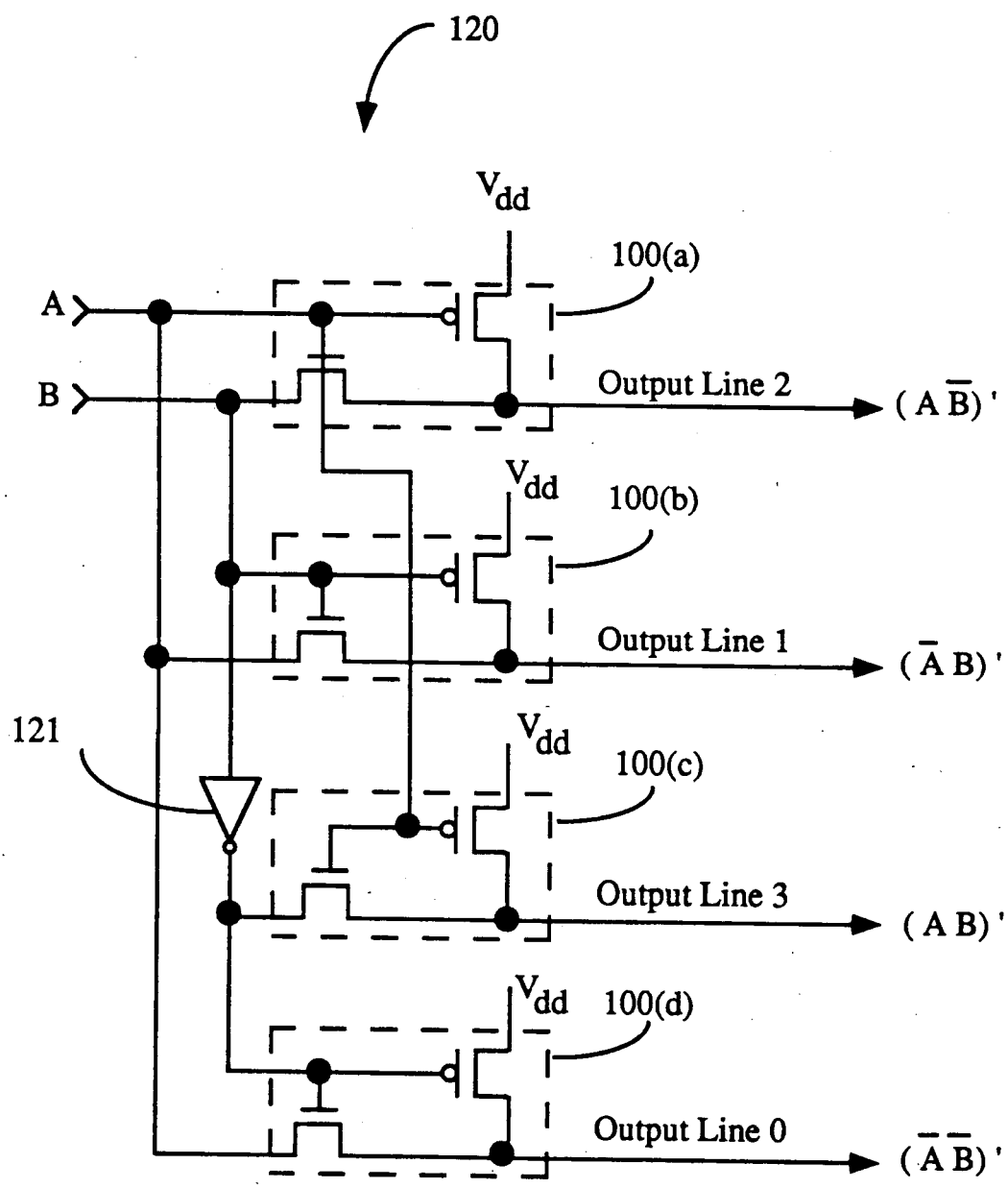
FIG. 8 shows a two-by-four decoder circuit which includes the dual input logic structure of FIG. 5.

Referring next to FIG. 8, a decoder circuit 120 is shown which implements a two-by-four decoder function. Decoder circuit 120 of FIG. 8 comprises four of the dual input logic structures 100(a)-(d) and an additional inverter gate 121. Only one output line of decoder 120 is logical LOW at a given time, depending upon the logical levels at input lines A and B. Decoder circuit 120 of FIG. 8 implements the decoding function using only ten CMOS transistors, in comparison to the circuit of FIG. 4 which, when implemented using conventional logic, requires twenty CMOS transistors.

Each of the digital circuits as shown in FIGS. 6–8 are composed of at least one dual input logic structure 100 and utilize a fewer number of transistors to implement its logical function than would be required if basic logic gates were used. Consequently, the circuits require a smaller area, allowing for a greater number of functions to be implemented within a single VLSI integrated circuit. In addition, the circuits having dual input logic structure 100 may operate quicker than the circuits using standard logic gate circuitry since there is a decrease in the amount of both gate loading and diffusion loading which accordingly decreases the time constants of the circuits.

Figure 9:
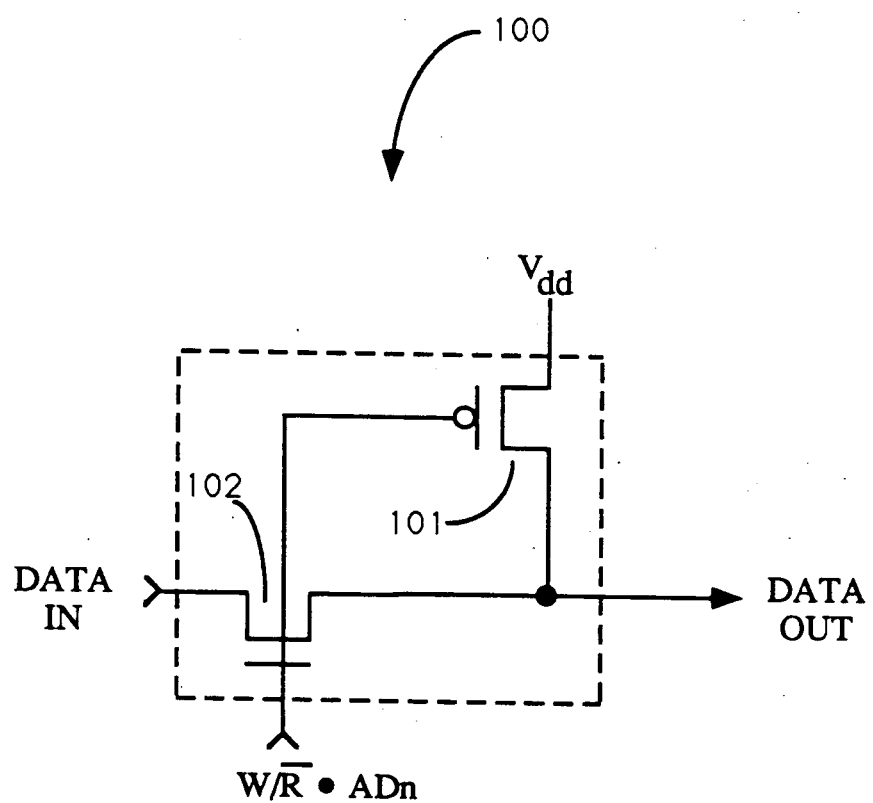
FIG. 9 shows the dual input logic structure implemented to latch data from an input port to an output port.

Dual input logic structure 100 may also be adapted for use within memory circuitry. FIG. 9 shows dual input logic structure 100 implemented to latch data from an input port (DATA IN) to an output port (DATA OUT). A write/read address line (W/$\overline{\text{R}}$·AD$_n$) is provided to the gate of each CMOS transistor 101 and 102. When the write/read address line (W/$\overline{\text{R}}$·AD$_n$) is logic LOW, P-channel FET 101 is turned on, and N-channel FET 102 is turned off. Consequently, the output level at the output port terminal goes to logic HIGH due to the source voltage V$_{dd}$. When the voltage level at the write/read address line is logic HIGH, P-channel transistor 101 is off and N-channel transistor 102 is turned on. Thus, the data at the input port is allowed to propagate to the output port.

Figure 10:
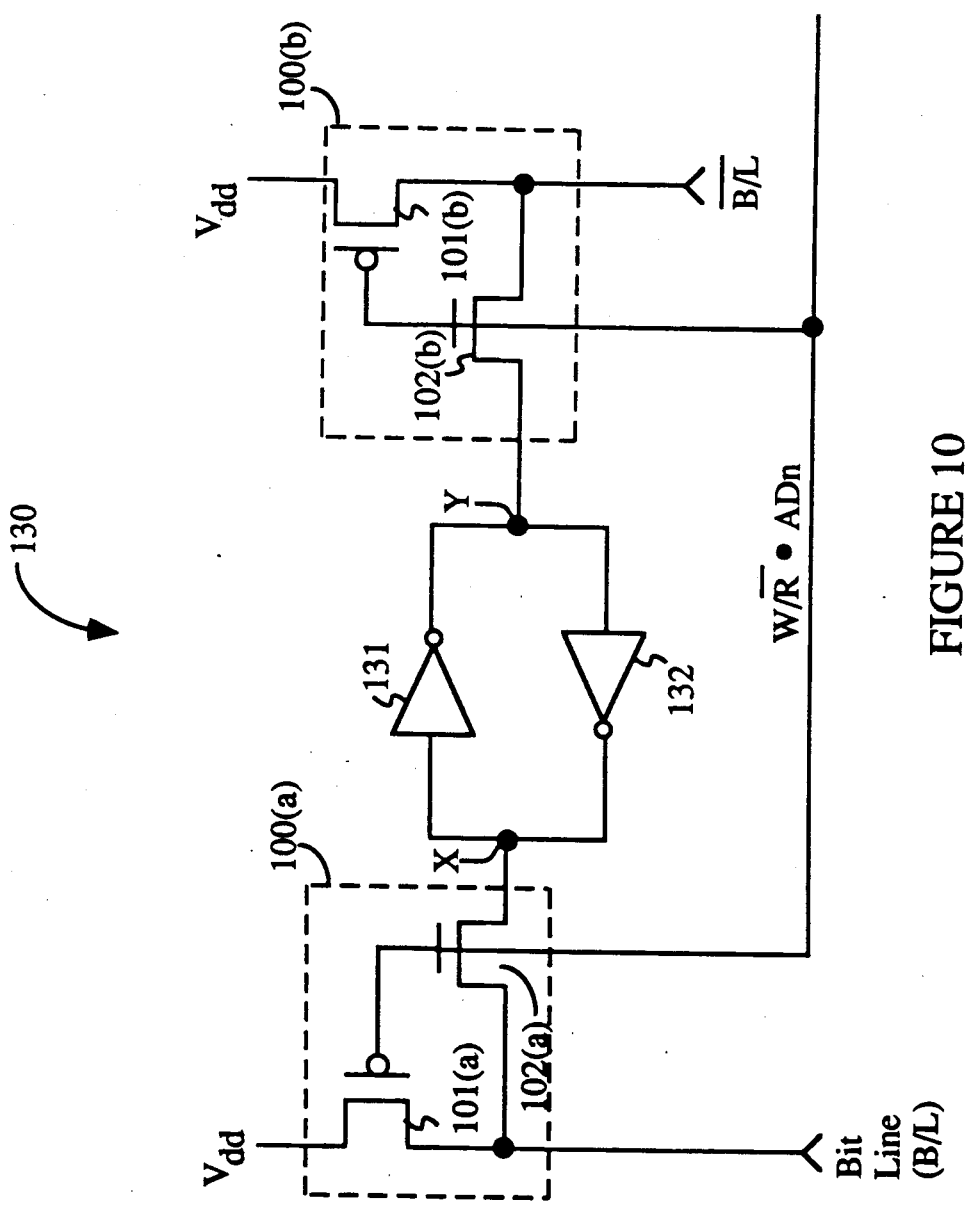
FIG. 10 shows the dual input logic structure implemented within a static RAM circuit.

FIG. 10 shows two dual input logic structures 100(a) and 100(b) implemented within a static RAM (random access memory) circuit 130. Memory circuit 130 also includes two inverters 131 and 132. When the level of the write/read address line (W/$\overline{\text{R}}$·AD$_n$) is logic LOW, memory circuit 130 is in a READ mode and a stored data value is available at the bit lines B/L and $\overline{\text{B/L}}$ since P-channel transistors 101(a) and 101(b) act as resistors with very high L/W values where L is channel length and W is channel width and since diffusion capacitance retains charge on the bit lines. Since P-channel transistors 101(a) and 101(b) act as active pull-ups, they do not affect the charge on the bit lines.

When the level of the write/read address line goes to logic HIGH, the memory enters a WRITE mode. In the WRITE mode, data on the bit line (B/L) propagates through N-channel transistor 102(a) to node X. Similarly, the complement of the data on the bit line $\overline{\text{B/L}}$ propagates through N-channel transistor 102(b) to node Y. When the write/read address line returns LOW, the data on the bit line terminal is stored at node X, and its complement is stored at node Y. The data is retained at the B/L and $\overline{\text{B/L}}$ lines due to pull-up transistors 101(a) and 101(b) and the diffusion capacitance. A sense amplifier may consequently read the data on the bit lines.

Figure 11:
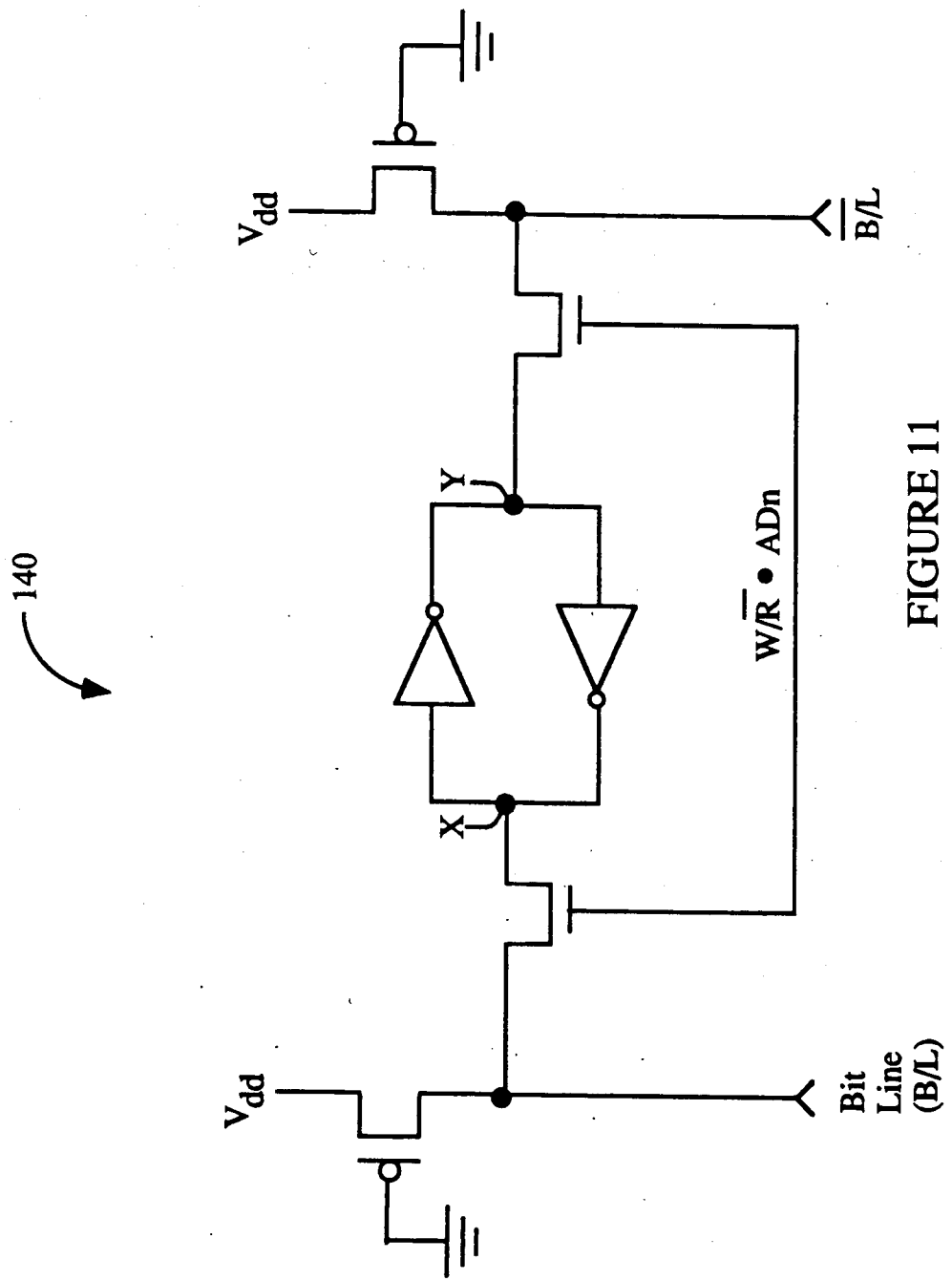
FIG. 11 shows a conventional RAM circuit.

Static RAM circuit 130 as implemented in FIG. 10 has a faster access time and a faster cycle time than the conventional RAM circuit 140 shown in FIG. 11 since static RAM 130 includes an active pull-up at the B/L and $\overline{\text{B/L}}$ bit lines when N-channel transistors 102(a) and 102(b) turn off. Furthermore, the conductor connecting the gates of transistors 101(a), 101(b), 102(a) and 102(b) increases the defined area, and therefore increases the storage node capacitance. Therefore, the storage node charge reduces the soft error rate of the RAM since the transistors' states are not as susceptible to voltage spikes. In addition, a pre-charge node is provided at the gates of transistors 101(a), 101(b), 102(a) and 102(b) and no refresh cycle is required. Finally, due to the active pull-up, the RAM circuit consumes less power during the WRITE mode since transistors 101(a) and 101(b) turn off.

The embodiments described above are intended to be exemplary and not limiting. In view of the above disclosure, modifications will be obvious to one of ordinary skill in the art without departing from the scope of the invention.

I claim:

1. A multiplexer circuit comprising:
    a first N-channel field effect transistor having a first terminal, a second terminal, and a gate; and
    a first P-channel field effect transistor having a drain, a gate, and a source, wherein the drain of said first P-channel field effect transistor is connected to the first terminal of said first N-channel field effect transistor whereat an output node is formed for supplying a first voltage, and wherein the gate of said first P-channel field effect transistor is connected to the gate of said first N-channel field effect transistor whereat a first input node is formed for receiving a second voltage, and wherein the second terminal of said first N-channel field effect transistor forms a second input node for receiving a third voltage, and wherein the source of said first P-channel field effect transistor forms a node for receiving a fourth voltage;

a second P-channel field effect transistor having a drain, a gate, and a source, wherein the drain of said second P-channel field effect transistor is connected to the source of said first P-channel field effect transistor, and wherein the source of said second P-channel field effect transistor forms a node for receiving a fifth voltage; and a second N-channel field effect transistor having a first terminal, a second terminal, and a gate, wherein the first terminal of said second N-channel field effect transistor is connected to the first terminal of said first N-channel field effect transistor and to the drain of said first P-channel field effect transistor, and wherein the gate of said second N-channel field effect transistor and the gate of said second P-channel field effect transistor are connected to form a third input node for receiving a sixth voltage, and wherein the second terminal of said second N-channel field effect transistor forms a fourth input node for receiving a seventh voltage.

2. An exclusive NOR gate comprising:

a first N-channel field effect transistor having a first terminal, a second terminal, and a gate; and a first P-channel field effect transistor having a drain, a gate, and a source, wherein the drain of said first P-channel field effect transistor is connected to the first terminal of said first N-channel field effect transistor whereat an output node is formed for supplying a first voltage, and wherein the gate of said first P-channel field effect transistor is connected to the gate of said first N-channel field effect transistor whereat a first input node is formed for receiving a second voltage, and wherein the second terminal of said first N-channel field effect transistor forms a second input node for receiving a third voltage, and wherein the source of said first P-channel field effect transistor forms a node for receiving a fourth voltage;

a second N-channel field effect transistor having a first terminal, a second terminal, and a gate, wherein the first terminal of said second N-channel field effect transistor is connected to the gate of said first N-channel field effect transistor, and wherein the second terminal of said second N-channel field effect transistor is connected to the first terminal of said first N-channel field effect transistor and to the drain of said first P-channel field effect transistor; and a second P-channel field effect transistor having a drain, a gate, and a source, wherein the drain of said second P-channel field effect transistor is connected to the source of said first field effect transistor, and wherein the gate of said second P-channel transistor is connected to the gate of said second N-channel field effect transistor, and wherein the source of said second P-channel field effect transistor forms a node for receiving a fifth voltage.

3. A decoder circuit comprising:

a first P-channel FET having a drain, a gate, and a source, wherein the gate is connected to a first input node; and wherein the source forms a node for receiving a first voltage;

a first N-channel FET having a first terminal, a second terminal, and a gate, wherein the first terminal is connected to a second input node, and wherein the second terminal is connected to the drain of said first P-channel FET and forms a first output node, and wherein the gate is connected to the gate of said first P-channel FET;

a second P-channel FET having a drain, a gate, and a source, wherein the source is connected to said node for receiving said first voltage, and wherein the gate is connected to the first terminal of said first N-channel FET;

a second N-channel FET having a first terminal, a second terminal, and a gate, wherein the gate is connected to the gate of said second P-channel FET, and wherein the first terminal is connected to said first input node, and wherein the second terminal is connected to the drain of said second P-channel FET and forms a second output node;

an inverter having an input line and an output line, the input line connected to said second input node;

a third P-channel FET having a drain, a gate, and a source, wherein the gate is connected to the gate of said first P-channel FET, and wherein the source is connected to said node for receiving said first voltage;

a third N-channel FET having a first terminal, a second terminal, and a gate, wherein the gate is connected to the gate of said third P-channel FET, and wherein the first terminal is connected to the output line of said inverter, and wherein the second terminal is connected to the drain of said third P-channel FET and forms a third output node;

a fourth P-channel FET having a drain, a gate, and a source, wherein the source is connected to said node for receiving said first voltage, and wherein the gate is connected to the output line of said inverter; and a fourth N-channel FET having a first terminal, a second terminal, and a gate, wherein the gate is connected to the output line of said inverter, and wherein the first terminal is connected to said first input node, and wherein the second terminal is connected to the drain of said fourth P-channel FET and forms a fourth output node.

4. A random access memory circuit comprising:

a first P-channel FET having a drain, a gate, and a source, wherein the source forms a node for receiving a first voltage;

a first N-channel FET having a first terminal, a second terminal, and a gate, wherein the gate of said first N-channel FET is connected to the gate of said first P-channel FET, and wherein the first terminal is connected to the drain of said first P-channel FET and forms a first bit line;

a first inverter having an input line and an output line, wherein the input line is connected to the second terminal of said first N-channel FET;

a second inverter having an input line and an output line, wherein the output line is connected to the second terminal of said first N-channel FET;

a second P-channel FET having a drain, a gate, and a source, wherein the source is connected to said node for receiving a first voltage; and a second N-channel FET having a first terminal, a second terminal, and a gate, wherein the first terminal is connected to the drain of said second P-channel FET and forms a second bit line, and wherein the gate is connected to the gate of said second P-channel FET, and wherein the second terminal is connected to the output line of said first inverter and to the input line of said second inverter, and wherein the gate of said first N-channel FET is connected to the gate of said second N-channel FET and forms a node for receiving a second voltage.

* * * * *